United States Patent
Suh et al.

(10) Patent No.: US 6,762,104 B2
(45) Date of Patent: Jul. 13, 2004

(54) METHOD FOR FABRICATING SEMICONDUCTOR DEVICE WITH IMPROVED REFRESH CHARACTERISTICS

(75) Inventors: Moon Sik Suh, Kyoungki-do (KR); Sung Kye Park, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/328,098

(22) Filed: Dec. 23, 2002

(65) Prior Publication Data

US 2003/0124822 A1 Jul. 3, 2003

(30) Foreign Application Priority Data

Dec. 27, 2001 (KR) .................................. 10-2001-0085872

(51) Int. Cl.[7] ...................... H01L 21/311; H01L 21/336
(52) U.S. Cl. ...................... 438/303; 438/305; 438/297; 438/714
(58) Field of Search .................................. 438/297, 302, 438/303, 305, 714, 723, 724, 954; 257/369–374

(56) References Cited

U.S. PATENT DOCUMENTS

| | | | | |
|---|---|---|---|---|
| 5,376,566 A | * | 12/1994 | Gonzalez | 438/253 |
| 5,409,848 A | * | 4/1995 | Han et al. | 438/302 |
| 5,432,107 A | | 7/1995 | Uno et al. | |
| 5,439,835 A | * | 8/1995 | Gonzalez | 438/241 |
| 5,593,907 A | | 1/1997 | Anjum et al. | |
| 5,773,862 A | * | 6/1998 | Peng et al. | 257/316 |
| 5,874,329 A | * | 2/1999 | Neary et al. | 438/203 |
| 6,080,630 A | * | 6/2000 | Milic-Strkalj et al. | 438/305 |
| 6,083,795 A | * | 7/2000 | Liang et al. | 438/289 |
| 6,144,068 A | * | 11/2000 | Kao et al. | 257/335 |
| 6,201,282 B1 | * | 3/2001 | Eitan | 257/390 |
| 6,297,111 B1 | * | 10/2001 | Krivokapic | 438/302 |
| 6,337,262 B1 | | 1/2002 | Pradeep et al. | |
| 6,355,954 B1 | * | 3/2002 | Gall et al. | 257/297 |
| 6,512,273 B1 | * | 1/2003 | Krivokapic et al. | 257/369 |
| 6,545,904 B2 | * | 4/2003 | Tran | 365/149 |
| 6,583,066 B2 | * | 6/2003 | Aloni et al. | 438/714 |

FOREIGN PATENT DOCUMENTS

| | | |
|---|---|---|
| JP | 8330587 | 9/1996 |
| JP | 0119001 | 4/2001 |

* cited by examiner

*Primary Examiner*—Michael Lebentritt
(74) *Attorney, Agent, or Firm*—Ladas & Parry

(57) ABSTRACT

Disclosed is a method for fabricating a semiconductor device wherein boron-halo ion implantation is performed only to a bit-line contact part while masking a storage node contact part. The method comprises the steps of: performing a first ion implantation into the semiconductor substrate to control the threshold voltage Vt; forming a gate electrode on the semiconductor substrate in which the first ion implantation has been performed; performing a second ion implantation with a tilt of desired degree, using the gate electrode as a mask in order to control the threshold voltage; and performing a third ion implantation to form an LDD region in the substrate region at both sides of the gate electrode. In this method, the first ion implantation is performed at a range of below 90% of the whole doping concentration required to control the threshold voltage, and the second ion implantation is performed with a degree of below 30° and in two directions or four directions vertical to the gate electrode.

8 Claims, 4 Drawing Sheets

METHOD FOR FABRICATING SEMICONDUCTOR DEVICE WITH IMPROVED REFRESH CHARACTERISTICS

BACKGROUND OF THE INVENTION

1. Field of the Invention

The present invention relates to a method for fabricating a semiconductor device, and more particularly to a method for fabricating a semiconductor device capable of improving reduction of refresh characteristics due to a decrease of design rule.

2. Description of the Prior Art

As generally known in the art, a DRAM (Dynamic Random Access Memory) device belongs to a memory device that can read out stored data if required, is composed of DRAM cells, and includes a MOS transistor acting as a switch and a capacitor storing data, i.e., electrical charges.

With regard to a DRAM device, data storage refers to an accumulation of electrical charges in the capacitor, and the electrical charges accumulated in the capacitor ideally do not vanish. However, initial electrical charges stored in the capacitor may vanish due to leakage currents produced in a p-n junction, etc., of the MOS transistor, thereby producing a natural loss of data.

Accordingly, it is required to recharge the DRAM device to an amount of initial electrical charge, corresponding to the readout information after reading out the stored data, prior to the complete vanishing of the stored data in the respective DRAM cells. This recharging process of the electrical charges stored in cells is referred to as a refresh action, and data storage in the respective DRAM cells can be maintained by the periodical repetition of the refresh action.

In this procedure, the period of the refresh action closely relates to a forming process of a capacitor, and it is controlled by ion implantation after the formation of a storage node contact in the general fabrication process of the DRAM. That is, with regard to a conventional DRAM device, impurities are implanted into an exposed source/drain region in order to improve the refresh characteristics, i.e., to reduce the electric field in the junction region.

However, a high channel doping with a concentration below about $2.0E13/cm^2$ is required to control a threshold voltage of a sub-cell transistor having a size of 0.15 μm following the decrease of the design rule. Here, the concentration of a LDD (low doped drain) region increases to produce the serious increase of the electrical field in the junction region, and as a result, the refresh time remarkably decreases due to the increase of the abnormal junction leakage originated from a trap assisted tunneling.

Meanwhile, in the conventional art, ion implantation is additionally performed to control the threshold voltage of a channel by masking the storage node part, i.e., the junction part in contact with the capacitor to improve the decrease of the refresh time. At this time, the refresh time and the threshold voltage vary drastically because of the misalignment during the ion implantation of the threshold voltage region and the formation of the gate.

As described above, there has been a limitation in achieving an electrical field mitigation in the junction region with a conventional DRAM fabrication process, following the decrease of the design rule, and it has been difficult to secure refresh characteristics.

SUMMARY OF THE INVENTION

Accordingly, the present invention has been made to solve the above-mentioned problems occurring in the prior art, and an object of the present invention is to provide a method for fabricating a semiconductor device capable of improving a refresh characteristics.

In order to accomplish this object, there is provided a method for fabricating a semiconductor device, comprising the steps of: performing a first ion implantation into the semiconductor substrate to control the threshold voltage Vt, forming a gate electrode on the semiconductor substrate in which a first ion implantation having been performed, performing a second ion implantation using the gate electrode as a mask with a tilt of desired degree in order to control the threshold voltage, and performing a third ion implantation to form an LDD region in the substrate region at both sides of the gate electrode.

In the method of the present invention, the first ion implantation is performed at a concentration range of below 90% of the whole doping concentration required to control the threshold voltage, and the second ion implantation is performed at an angle of less than 30°, and at two directions or four directions vertical to the gate electrode.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings.

FIGS. 1a to 1d are cross-sectional views for illustrating each step of a method for fabricating a semiconductor device in accordance with one embodiment of the present invention.

Figure 1A:
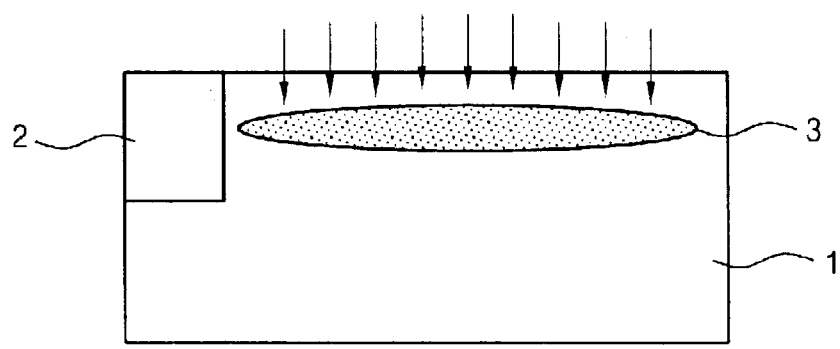
FIGS. 1a to 1d are cross-sectional views for illustrating each step of a method for fabricating a semiconductor device in accordance with one embodiment of the present invention.

Referring to FIG. 1a, a trench type device isolation layer 2 defining an active region is formed on the proper part of a semiconductor substrate 1 according to a shallow trench isolation (STI) process well known in the art. Then, implantation of impurities, e.g., boron (B) ions into the active region of the semiconductor substrate 1 is performed to control the threshold voltage of a cell transistor. At this time, the ion implantation for controlling the threshold voltage is preferably performed with a concentration below 90% of the whole doping concentration required to control the threshold voltage. Unexplained numeral 3 refers to a first ion implantation region for controlling the cell threshold voltage.

Figure 1B:
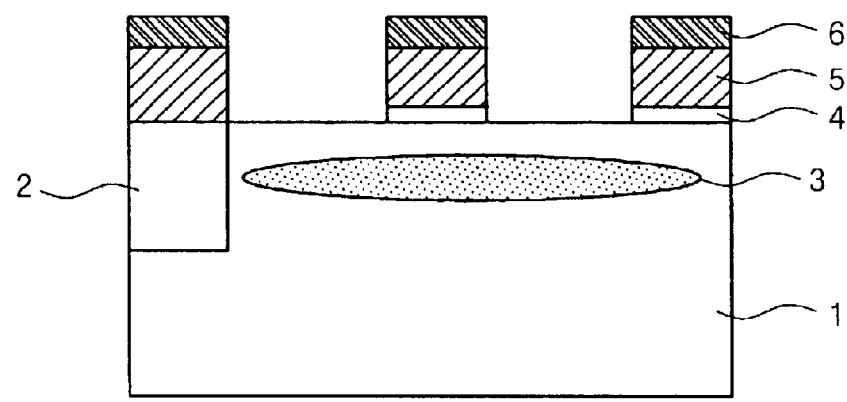

Referring to FIG. 1b, an oxide layer, a conductive layer, and a nitride layer are sequentially deposited on the semiconductor substrate 1, and then a gate electrode 5 is formed with a gate oxide layer 4 in a lower part thereof and a buffer nitride layer 6 in an upper part thereof by patterning the stacked layer with a lithography process well-known in the art.

Figure 1C:
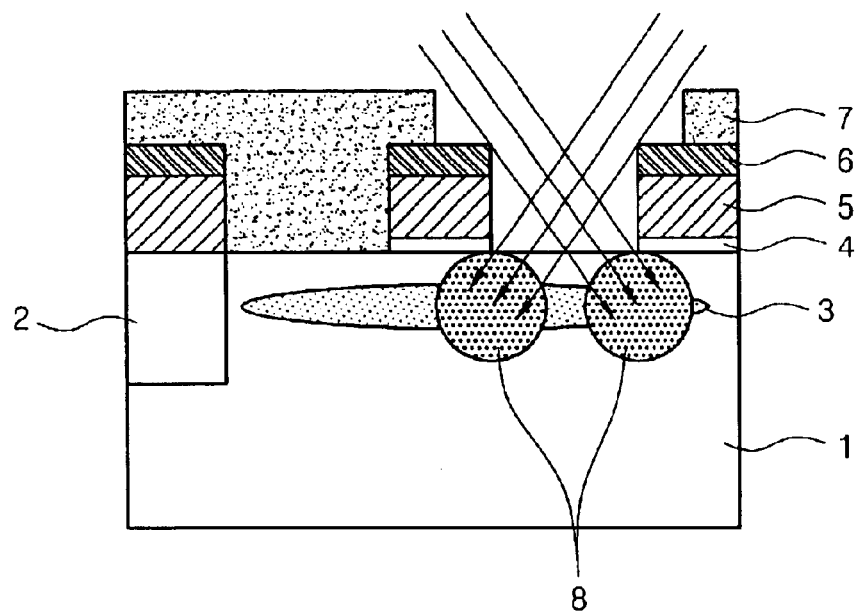

Referring to FIG. 1c, a photoresist layer pattern 7 that will be used for masking a storage node part, i.e., a part of the substrate intended to contact the storage node of a capacitor, is formed on the resultant structure. Then, ion implantation for controlling a threshold voltage is performed at a tilt of below 30° on a part of the substrate; more accurately speaking, a region intended to contact a bit-line in a process explained later, one that is not shielded by the photoresist layer pattern 7. Unexplained numeral 8 refers to a second ion implantation region for controlling a cell threshold voltage.

At this time, boron (B) is employed as the impurity for the ion implantation at a tilt explained in the above process, and the ion implantation is performed from two directions or four directions vertical to the gate electrode 5, and in particular, to a whole doping concentration of the ion implantation region for controlling the cell threshold voltage to be $1E12/cm^2$ to $1E14/cm^2$.

Figure 1D:
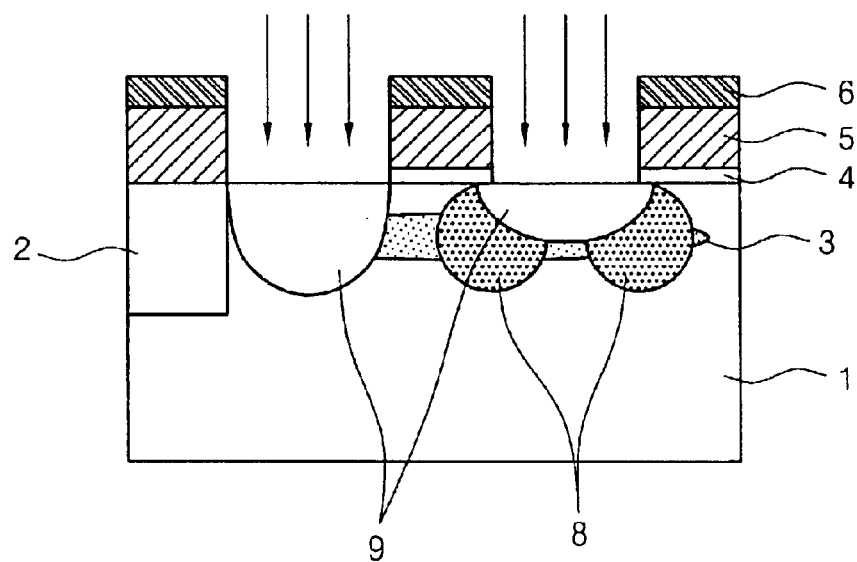

Referring to FIG. 1d, an LDD ion implantation is performed after removal of the photoresist layer pattern. At this time, the LDD ion implantation is performed through a blanket process, covering the storage node and a part of the substrate intended for contact with the bit-line. Unexplained numeral 9 refers to an LDD region.

Thereafter, a series of following processes such as formation of a junction region through high concentration ion implantation of impurities, and formation of a bit-line and a capacitor are performed sequentially, thus accomplishing production of the semiconductor device of the present invention.

As regards the semiconductor device fabricated through the process described above, since boron-halo implantation is performed only at the substrate region intended for contact with the bit-line through tilted ion implantation, the channel boron concentration in the region in contact with the storage node can be comparatively decreased, thereby lowering the electrical field in the region in contact with the storage node. As a result, abnormal junction leakage originating from the trap assisted tunneling can be decreased and the refresh time, e.g., the refresh characteristics can be improved.

Specifically, with reference to FIGS. 2 and 3, electrical field and channel boron concentration in the region in contact with the storage node of the semiconductor device fabricated in accordance with the present invention are explained below.

Figure 2A:
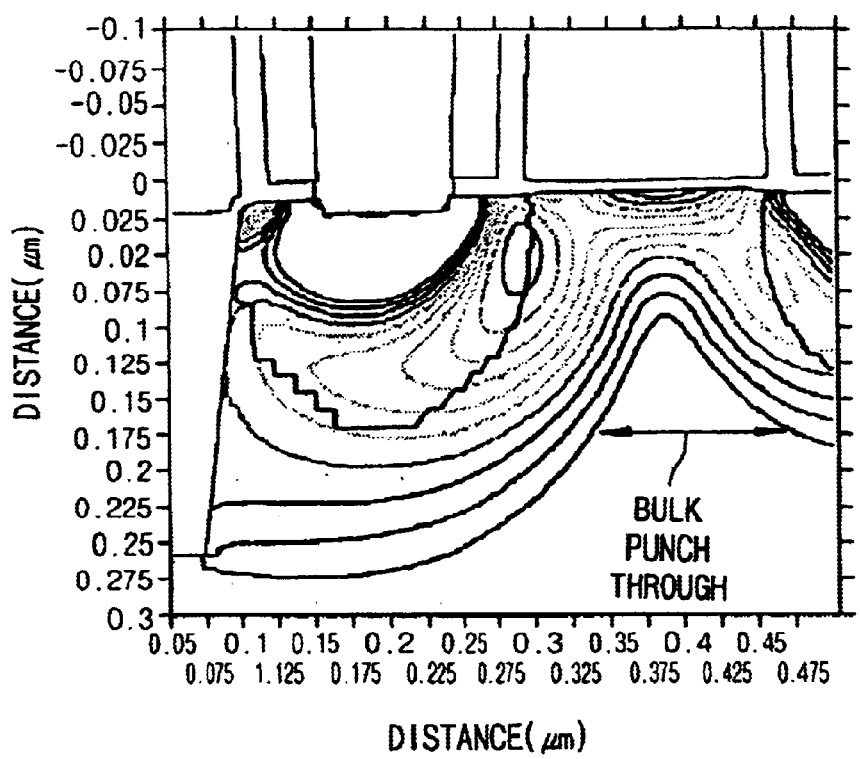
FIGS. 2a and 2b are views showing results of simulation for illustrating a relation between an electrical field and channel boron concentration in a junction region of the semiconductor device in accordance with a conventional art.
Figure 2B:
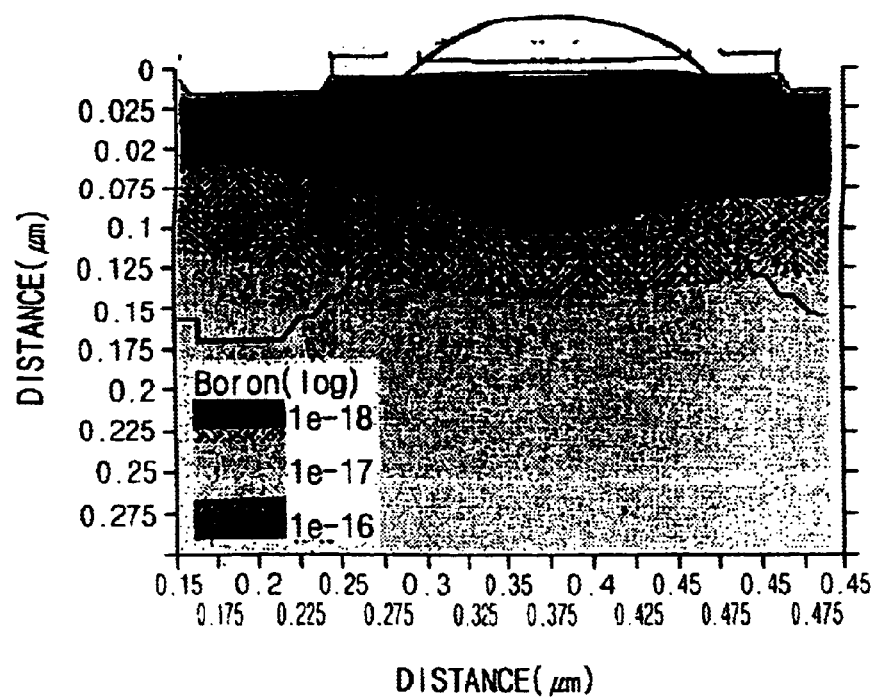
Figure 3A:
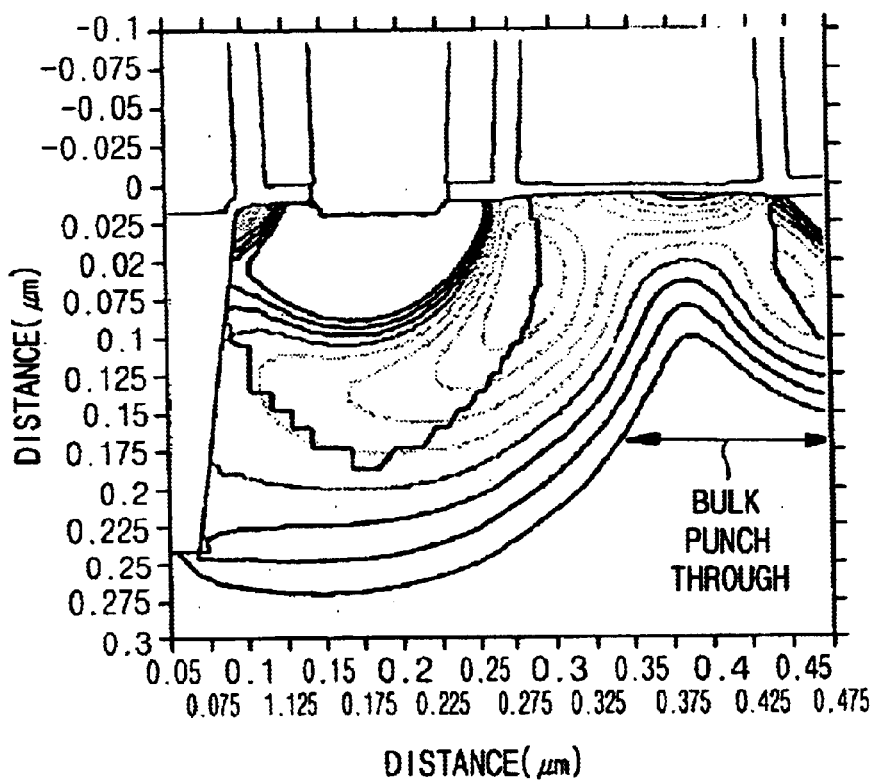
FIGS. 3a and 3b are views showing results of simulation for illustrating a relation between an electrical field and channel boron concentration in a junction region of the semiconductor device in accordance with the present invention.
Figure 3B:
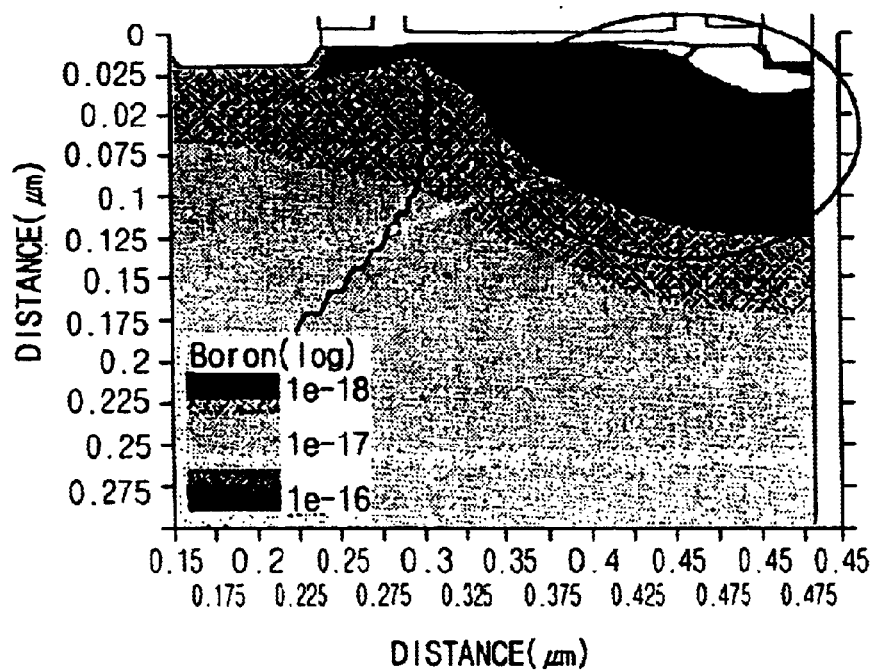

Firstly, with regards the electrical field in the region contacted with the storage node, as shown in FIGS. 2a and 2b, in the case of a semiconductor device fabricated in accordance with the conventional art, an expected threshold voltage Vt is below 0.985V, maximum electrical field E-Field$_{max}$ is below 0.48 MV/cm, and the expected refresh time tREF is below 236 ms. However, in the case of a semiconductor device fabricated in accordance with the present invention, as shown in FIGS. 3a and 3b, the expected threshold voltage Vt is below 0.868V, maximum electrical field E-Field$_{max}$ is below 0.42 MV/cm, and the expected refresh time tREF is below 236 ms.

Next, with regard to the channel boron concentration, the present invention incorporates a comparatively lower doping concentration than that of the conventional case.

Accordingly, since the semiconductor device of the present invention has a lower electrical field than that of the conventional case, the leakage currents are reduced, resulting in improved refresh characteristics.

Further, since the ion implantation for controlling the threshold voltage is performed in the region in contact with the bit-line after the formation of the gate, the decrease of refresh characteristics originating from the misalignment of the masks at the time of ion implantation or gate formation, as in the conventional case, can be obviated.

In addition, according to the present invention, the depth of the region contacted with the bit-line is maintained below a maximum value to thereby form an asymmetric junction, resulting in improvement of the bulk punch-through margin as shown in FIGS. 2a to 3b.

Also, according to the present invention, since the channel off current can be reduced due to the increase of the energy barrier, in accordance with the high channel concentration in the region contacted with the bit-line, it is easier to control the threshold voltage than in the conventional case.

Meanwhile, although the LDD ion implantation has been performed after performing the ion implantation to the bit-line contact part in the above embodiment of the present invention, the LDD ion implantation can be performed beforehand.

Further, with regard to the ion implantation to the bit-line contact part, it can be performed at 90°, i.e., by a single ion implantation instead of the tilted ion implantation.

Besides, although not described in the above, additional ion implantation of phosphorous P or Arsenic As can be performed after the ion implantation to the bit-line contact part to thereby reduce the resistance Rc of the bit-line.

As described above, according to the present invention, the threshold voltage is controlled by performing boron-halo ion implantation only to the bit-line contact part while masking the storage node contact part in order to lower the channel boron concentration of the storage node contact part and thereby mitigate the electrical field, resulting in improvement of the characteristics in the DRAM device including the refresh characteristics.

Also, according to the present invention, since the bit-line contact is made to be a thin asymmetric contact, the bulk punch-through margin is improved, resulting in improvement of the characteristics of the semiconductor device.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for fabricating a semiconductor device, comprising the steps of:
  performing a first ion implantation into a semiconductor substrate to control a threshold voltage;
  forming a gate electrode on the semiconductor substrate in which the first ion implantation has been performed;
  performing a second ion implantation with a tilt of desired degree, using the gate electrode as a mask in order to control the threshold voltage; and
  performing a third ion implantation to form an LDD region in the substrate region at both sides of the gate electrode.

2. The method for fabricating a semiconductor device according to claim 1, wherein the first ion implantation is performed at a range of below 90% of a whole doping concentration required to control the threshold voltage.

3. The method for fabricating a semiconductor device according to claim 1, wherein the second ion implantation is performed with a degree of below 30°.

4. The method for fabricating a semiconductor device according to claim 1 or claim 3, wherein the second ion implantation is performed in two directions or four directions vertical to the gate electrode.

5. The method for fabricating a semiconductor device according to claim 1, further comprising a step of performing an ion implantation of phosphorous or Arsenic after the second ion implantation and prior to the third ion implantation.

6. The method for fabricating a semiconductor device according to claim 1 or claim 3, wherein the second ion implantation is performed at a whole doping concentration of 1E12 to 1E14/cm$^2$.

7. The method for fabricating a semiconductor device according to claim 1, wherein the ion implantation is first performed to form an LDD region in the substrate region at both sides of the gate electrode, and then the ion implantation is performed with a tilt of desired degree using the gate electrode as a mask in order to control the threshold voltage.

8. The method for fabricating a semiconductor device according to claim 1, wherein the second ion implantation is performed by a single ion implantation manner at 90° to the surface of the gate electrode.

* * * * *